United States Patent
Nandy et al.

(10) Patent No.: US 9,148,099 B2
(45) Date of Patent: Sep. 29, 2015

(54) HDMI RECEIVER

(75) Inventors: Tapas Nandy, Delhi (IN); Nitin Gupta, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 216 days.

(21) Appl. No.: 12/980,878

(22) Filed: Dec. 29, 2010

(65) Prior Publication Data

US 2012/0169438 A1    Jul. 5, 2012

(51) Int. Cl.
  *H03K 17/16*    (2006.01)
  *H03K 19/003*   (2006.01)
  *H03F 3/45*     (2006.01)

(52) U.S. Cl.
  CPC ........ *H03F 3/45928* (2013.01); *H03F 3/45475* (2013.01); *H03F 2200/294* (2013.01); *H03F 2200/411* (2013.01); *H03F 2203/45594* (2013.01); *H03F 2203/45596* (2013.01); *H03F 2203/45631* (2013.01); *H03F 2203/45702* (2013.01)

(58) Field of Classification Search
  USPC .............................................. 326/82–87, 30
  See application file for complete search history.

(56) References Cited

U.S. PATENT DOCUMENTS

| | | | |
|---|---|---|---|
| 7,679,395 B1* | 3/2010 | Yang et al. | 326/27 |
| 8,019,019 B1* | 9/2011 | Tetzlaff et al. | 375/319 |
| 2004/0246026 A1* | 12/2004 | Wang et al. | 326/86 |
| 2004/0251983 A1* | 12/2004 | Hsu et al. | 333/32 |
| 2007/0097658 A1* | 5/2007 | Yang et al. | 361/780 |
| 2008/0012642 A1* | 1/2008 | Cranford et al. | 330/258 |
| 2008/0137721 A1* | 6/2008 | Hsu et al. | 375/231 |

* cited by examiner

*Primary Examiner* — Anh Tran
(74) *Attorney, Agent, or Firm* — Gardere Wynne Sewell LLP

(57) ABSTRACT

An embodiment of a transmitter includes an amplifier having first and second differential output nodes, a first supply node, a first pull-up impedance having a first node coupled to the first differential output node and having a second node coupled to the supply node, and a second pull-up impedance having a first node coupled to the second differential output node and having a second node coupled to the supply node. An embodiment of a receiver includes an amplifier having first and second differential input nodes, a first supply node, a first pull-up impedance having a first node coupled to the first differential input node and having a second node coupled to the supply node, and a second pull-up impedance having a first node coupled to the second differential input node and having a second node coupled to the supply node. In an embodiment, the transmitter and receiver are capacitively coupled to one another.

18 Claims, 4 Drawing Sheets

HDMI RECEIVER

TECHNICAL FIELD

An embodiment of the present application relates to methods and apparatus for operating according to HDMI standards. An embodiment further relates to, but is not limited to, methods and apparatus for HDMI receivers.

BACKGROUND

HDMI (high definition multimedia interface) is a compact audio/video interface for transmitting uncompressed digital data. An HDMI connection is a DC open drain connection between a transmitter and a receiver respectively. An example of an HDMI transmitter/receiver can be seen in FIG. 1.

In FIG. 1, a transmitter 110 comprises a differential pair of open drain transistors 111 which transmit differential data over lines TX+ 140 and TX− 150 to a receiver 120 over the channel 130. The transistors 111 draw current from a voltage source AVcc 121 of the receiver and a voltage drop across terminating resistors 123 and 122 is used to determine the transmitted data. A current source 112 is used to determine the current drawn from the receiver which may be 10 mA in accordance with the HDMI specification. HDMI also specifies that the AVcc supply voltage 121 at the receiver 120 is 3.3 volts with a +/−5% tolerance.

In order to comply with the HDMI specification, current technologies may require thick gate oxide layers or the application of a level shift to prevent the active regions of a CMOS transistor from directly experiencing the 3.3 volts. The manufacturing of thicker gate oxide layers may be problematic because of the expense and the thicker layers reduce a maximum switching rate of the transistor. Level shifting may limit the switching rate of a circuit. Level shifting may further require additional current drain circuitry to prevent the level shift transistors from becoming inactive, and this may increase power consumption.

Moreover in advanced technologies it may be difficult to provide 3.3V capabilities. For example the basic components of 40 nM, 32 nM and 20 nM technology may only handle about 1V, and thicker gate components in these technologies may be unable to handle the 3.3V required by the HDMI specification.

SUMMARY

Therefore a need exists to address the above-mentioned limitations.

According to a first embodiment there is provided an apparatus comprising: a first pull-up circuit for receiving differential signals from a transmitter; a second pull-up circuit for providing the differential signals to a receiver; and coupling circuitry between the first and second pull-up circuits; wherein the provided differential signals are ac-coupled.

The differential signals received from the transmitter may be dc coupled.

The first pull-up circuit may be HDMI compliant.

The receiver may be implemented in standard low voltage CMOS technology.

The coupling circuitry may comprise coupling capacitors.

The first pull-up circuitry may comprise: a first external pull-up resistor coupled to a first transmission line; and a second external pull-up resistor coupled to a second transmission line.

The first and second external resistor may be coupled in series between an external power source and respective the first and second transmission lines.

The second pull-up circuitry may comprise: a first internal pull-up resistor coupled to a first transmission line; and a second internal pull-up resistor coupled to a second transmission line.

The first and second internal resistor may be coupled in series between an internal power source and respective the first and second transmission lines.

The second pull-up circuit and receiver may be implemented on an integrated circuit.

The second pull-up circuit may be implemented on a receiver board.

The first pull-up circuit may be implemented on a receiver circuit board.

The first and second transmission lines may form a differential channel on an HDMI compliant cable.

The transmitter may see the apparatus as dc-coupled and the apparatus may see the transmitter as ac-coupled.

According to a second embodiment, there is provided an integrated circuit comprising: a receiver; and a first pull-up circuit for receiving a differential signal from a coupling circuitry and providing the differential signal to the receiver; wherein the provided differential signals are ac-coupled.

The integrated circuit may be for an HDMI receiver.

According to a third embodiment, there is provided a device comprising: a transmitter; a cable coupling the transmitter to receiver circuitry; the receiver circuitry comprising: a first pull-up circuit for receiving differential signals from the transmitter; a second pull-up circuit for providing the differential signals to a receiver; coupling circuitry between the first and second pull-up circuitry; and a receiver coupled to the second pull-up circuit; wherein the provided differential signals are ac-coupled.

The transmitter may see the apparatus as dc-coupled and the apparatus may see the transmitter as ac-coupled.

The transmitter may be implemented on a transmitter circuit board.

According to a fourth embodiment, there is provided an apparatus comprising: first pull-up means for receiving differential signals from a transmitter; second pull-up means for providing the differential signals to a receiver; and coupling means for coupling the first pull up means and the second pull-up means; wherein the provided differential signals are ac-coupled.

BRIEF DESCRIPTION OF THE DRAWINGS

Some embodiments will now be described by way of example only with reference to the accompanying Drawings in which.

In the figures described herein like reference numerals depict like features.

DETAILED DESCRIPTION

Embodiments allow an HDMI receiver to operate in an AC coupled mode. In this mode a receiver may see an HDMI transmitter as an AC coupled transmitter which may allow the receiver sink to function with a voltage below the 3.3V HDMI specified voltage. In embodiments the transmitter sees the receiver as being DC coupled and therefore is in accordance with the HDMI specification. In some embodiments the AC coupled mode may be implemented through use of a few inexpensive onboard components. Embodiments may allow the receiver sink to be implemented using components that might be inappropriate for use with a higher voltage supply such as a 3.3V supply.

Figure 2A:
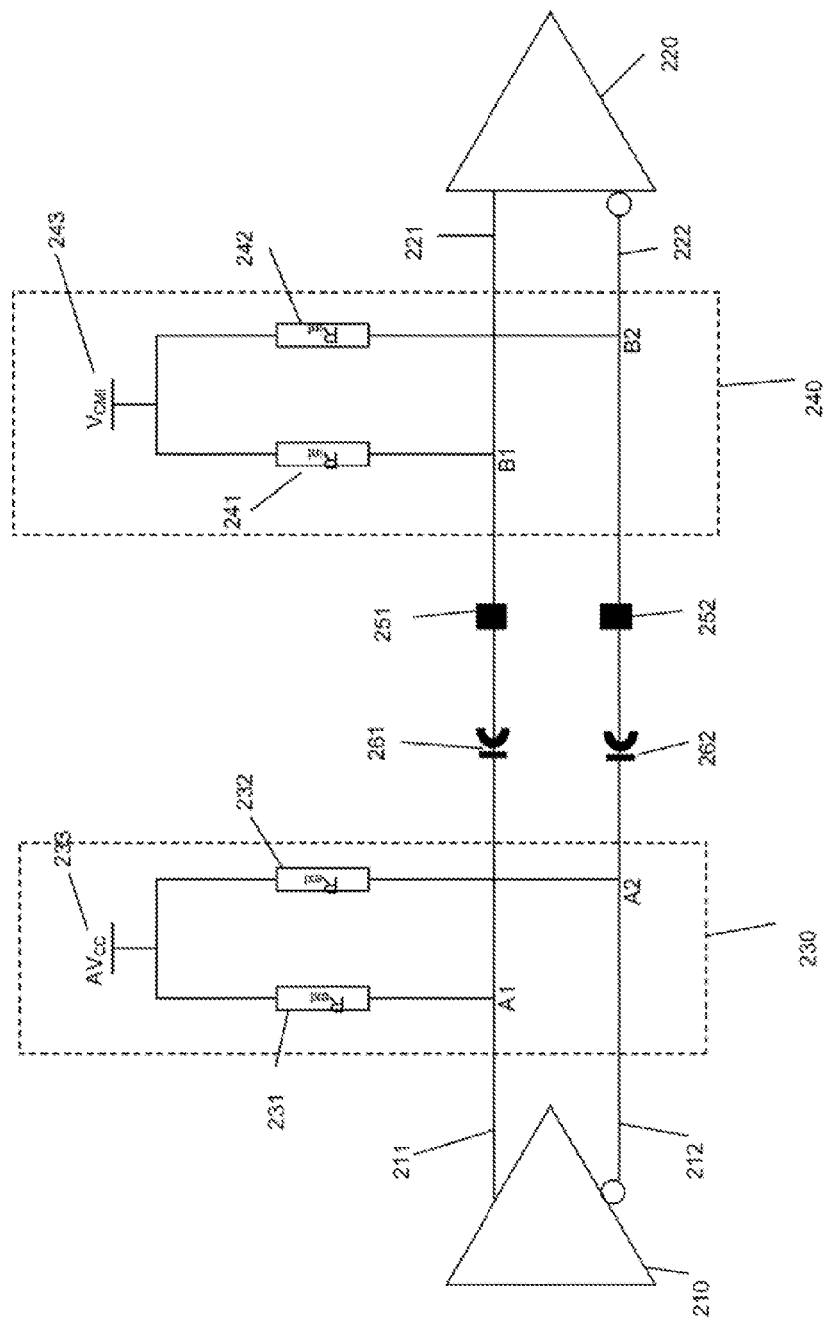
FIG. 2a shows a schematic diagram of an HDMI device in accordance with an embodiment.

FIG. 2a shows the schematic diagram of a HDMI device 200 in accordance with an embodiment. The device 200 comprises an HDMI transmitter 210 with a first and second differential output line 211 and 212. The HDMI transmitter 210 is coupled to a resistive pull-up circuitry 230 via the transmission lines 211 and 212 at points A1 and A2 respectively.

The resistive pull-up circuitry 230 appears to the transmitter 210 as a DC coupling and may also be referred to as DC coupling circuitry 230. The DC coupling circuitry 230 comprises first and second external resistors 231 and 232 coupled in series between a source AVcc and lines 211 and 212 respectively. The source AVcc may be HDMI compliant. In other words, AVcc may be equal to 3.3V in accordance with the HDMI specification. In this manner, the transmitter may see a differential receiver 220 as DC coupled with a common mode voltage AVcc in accordance with the HDMI specification.

The DC coupling circuitry 230 is coupled first and second coupling capacitors 261 and 262. The first coupling capacitor 261 connects the differential output line 211 to a receive pin 251 and the second coupling capacitor 262 connects the second differential output line 212 to a receive pin 252. The receive pins 251 and 252 are further coupled to a further pull-up circuit 240 on lines 221 and 222. The further pull-up circuit 240 comprises first and second internal resistors 241 and 242 coupled in series between a source Vcmi and the lines 222 and 221 respectively. The source Vcmi provides a common-mode voltage to the differential receiver 220 and may provide a lower voltage than the DC coupling circuit 230 source AVcc. The further pull-up circuit 240 is further coupled to the differential receiver 220 via lines 221 and 222.

The source Vcmi may not be HDMI compliant and may provide a lower voltage than the source AVcc. In this manner, the transmitter 210 may appear to the differential receiver 220 as being AC-coupled and having a common-mode voltage that may be low enough for standard gate oxide layer CMOS components to handle. As the further pull-up circuit 240 causes the transmitter 210 to appear AC-coupled to the differential receiver 220, the further pull up circuitry may be referred to as AC coupling circuitry 240.

Figure 2B:
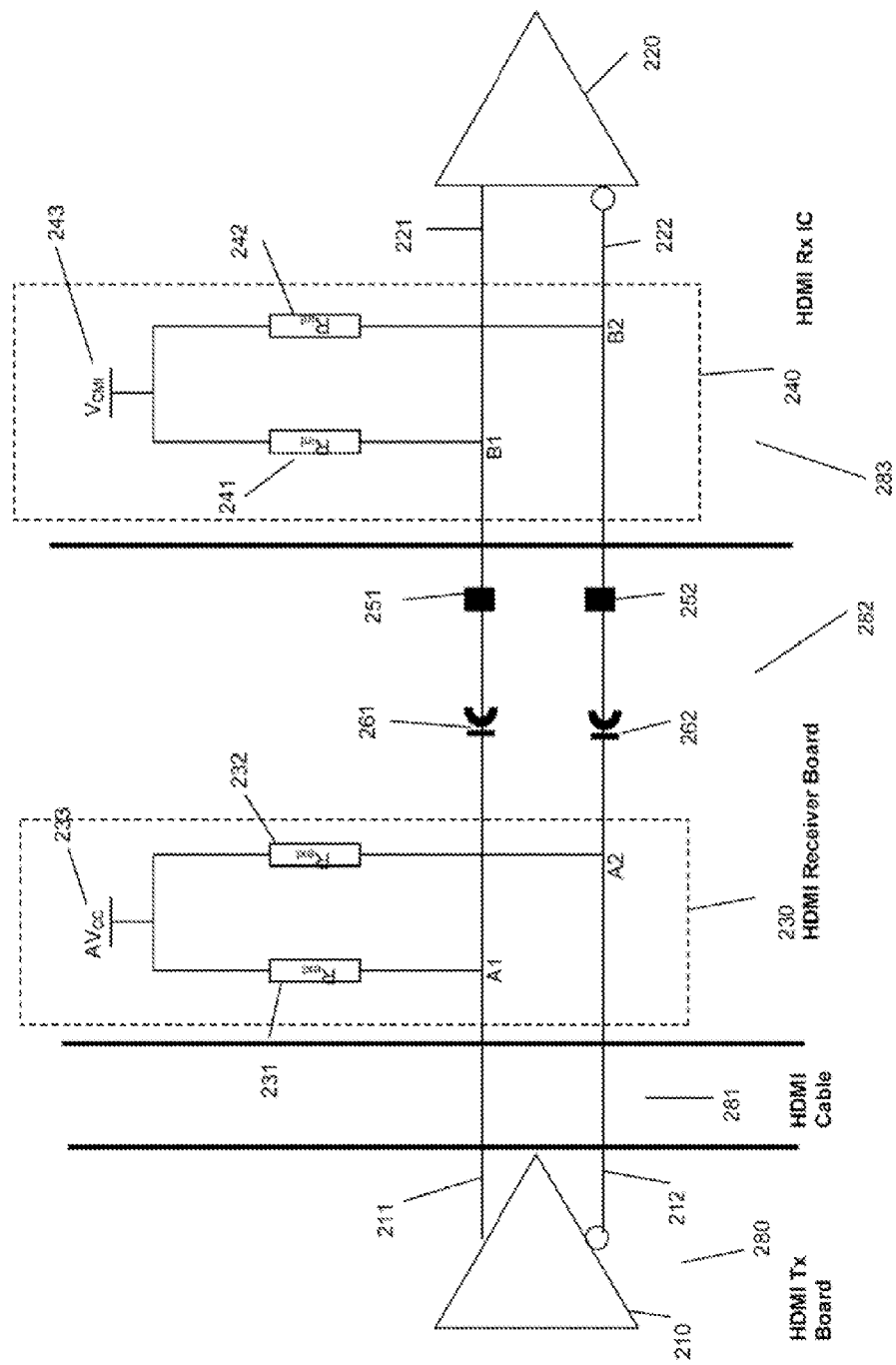
FIG. 2b shows a distribution of components of the HDMI device of FIG. 2a according to an embodiment.

FIG. 2b shows an example distribution of components of the HDMI device 200 of FIG. 2a. In embodiments, the differential transmitter 210 is implemented on an HDMI transmit board 280 and transmits differential signals over a cable 281 between the differential transmitter 210 and DC coupling circuitry 230. The DC coupling circuitry 230, coupling capacitors 261 and 262 and receive pins 251 and 252 may form part of an HDMI receive board 282. The AC coupling circuitry 240 and differential receiver 220 may be implemented on an HDMI receiver integrated circuit.

Embodiments may allow the differential receiver 220 and AC coupling circuitry 240 to be implemented using thin oxide CMOS technology.

Referring now to FIG. 2a, when differential data transmitted by the HDMI transmitter 210 is received at the first and second differential output lines 211 and 212, current is caused to flow through one of the first and second external resistors 231 or 232 and no current is drawn by the transmitter 210 through the other of the first and second external resistor 231 or 232 as determined by a transmitted symbol.

The current through the first or second external resistor 231 or 232 provides a voltage drop across that resistor and the voltage at the input to the coupling capacitors 261 and 262 may comprise a voltage swing as determined by the voltage drop across the external resistors 231 and 232. In some embodiments operating in accordance with the HDMI specification, a maximum voltage swing may be 0.6V and the input to the coupling capacitors 261 and 262 may vary between 3.3V and 2.7V during transmission. The transmitter 210 therefore sees a DC coupled circuit 230 coupled to its outputs 211 and 212.

The coupling capacitors 261 and 262 may act as DC blockers and allow only the AC signal components to pass. The AC voltage component let through by the coupling capacitors 261 and 262 may cause current to flow through the internal resistors 241 and 242. The current through the internal resistors 241 and 242 may cause a voltage drop across the internal resistors 241 and 242 which in turn provides a varying voltage signal on the first and second receiver transmission lines 221 and 222 input to the receiver 220.

In this manner the transmitted data may be input to the receiver 220 at a common mode voltage suitable for the receiver. For example the receiver may be implemented in advanced CMOS technology and the voltage swing at B1 and B2 may be within a range for this technology. In some embodiments the voltage swing at the input to the receiver 220 may be in the range of 0.6V.

As the coupling capacitors 261 and 262 and resistors 241 and 242, 231 and 232 form a high pass filter network, the value of the coupling capacitors 261 and 262 may be chosen as any suitable value which permits signal fluctuations to pass and blocks any significant DC component. In an AC mode the first external resistor 231 and first internal resistor 241 may be considered to be operating in parallel as the first and second voltage sources are DC sources. Similarly the second internal resistor 232 and second internal resistor 242 may be considered to be operating in parallel.

In some embodiments, the value of the coupling capacitors may be determined following the following equation:

$$C_{coupling} \gg \frac{1}{(2 \cdot (runlength of TMDS encoding) \cdot R_{ext} \| R_{int})} \quad (1)$$

Wherein Ccoupling is the capacitance of one of the coupling capacitors 261 and 262 and Rext//Rint is the effective parallel resistance of external resistor 231 and internal resistor 241 or external resistor 232 and internal resistor 242. RunlengthofTMDSencoding is the run length of the Transition Minimized Differential Signaling (TMDS) from the transmitter 210 to the receiver 220. Because calculation of the run length of the TMDS is conventional, further details of this calculation are omitted for brevity.

Figure 1:
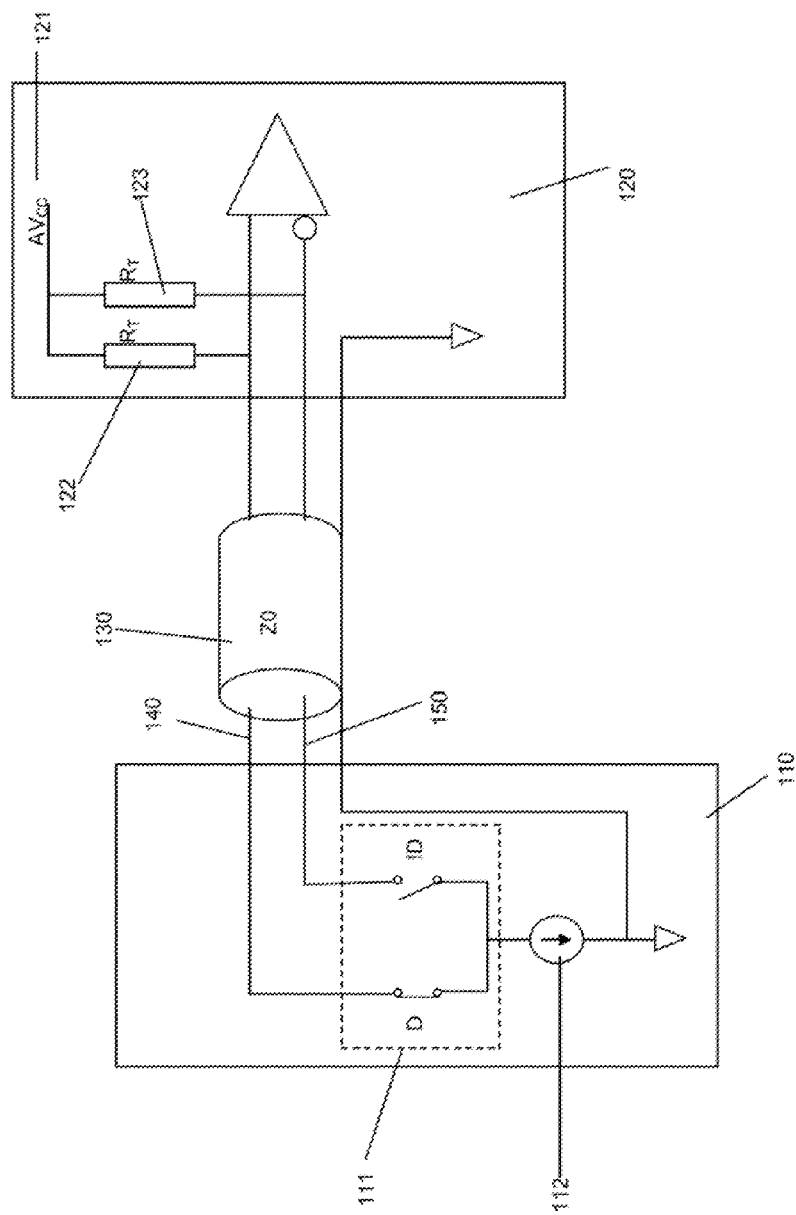
FIG. 1 shows an example of one channel of an HDMI compliant transmitter/receiver as known in the art.
Figure 3:
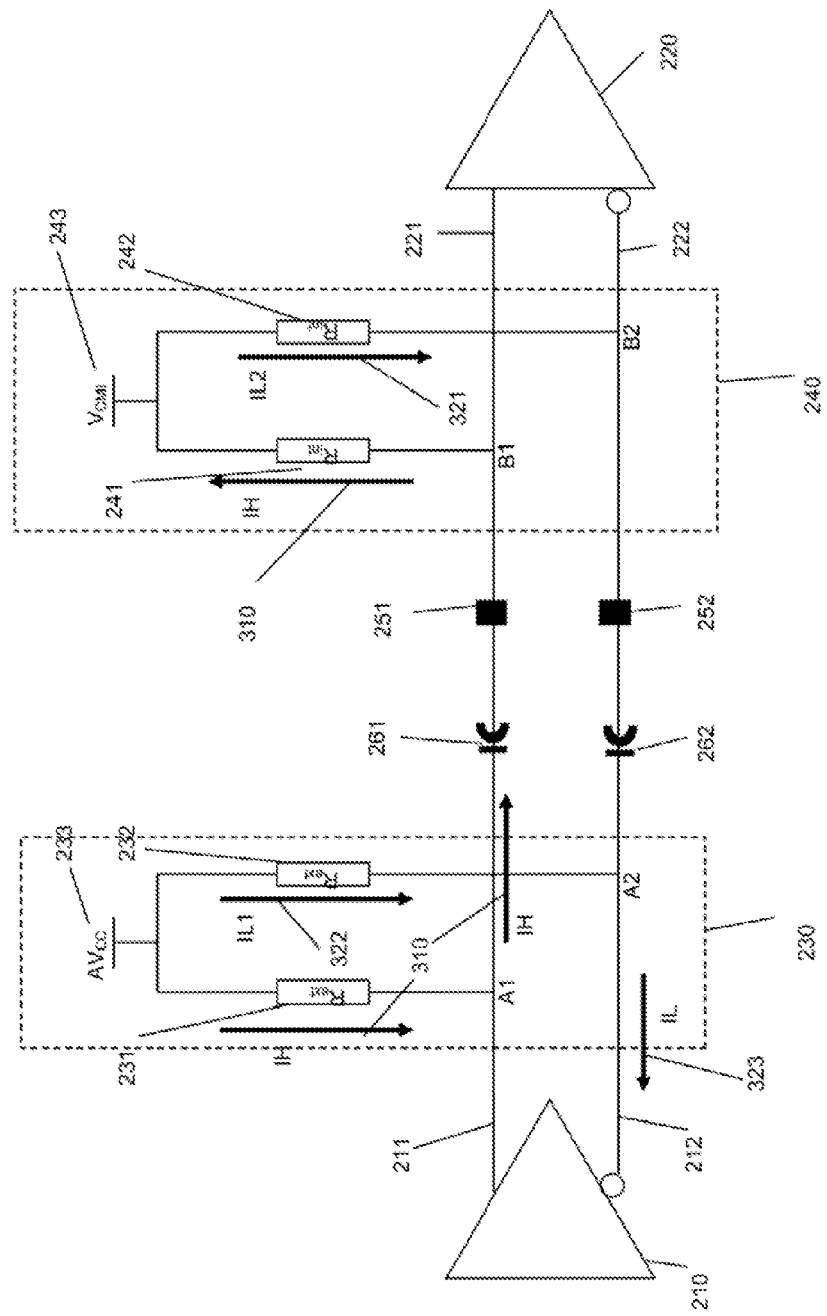
FIG. 3 shows the schematic diagram of FIG. 2 including current indications according to an embodiment.

FIG. 3 indicates a current flow in the circuitry of FIGS. 2a and 2b when the differential transmission is such that current is drawn into the transmitter from the second differential output line 212. This may correspond to switch D compliment in FIG. 1 being closed while switch D is open.

According to FIG. 3, an AC-voltage is passed through to the AC coupling circuitry 240 and a voltage at the first input 251 is high while a voltage at the second input pin 252 is low.

A current $I_H$ 310 flows between the first input pin 251 and Vcmi and is drawn from the DC voltage source AVcc 233 to the lower voltage source 243.

A second internal resistor current $I_{L2}$ 321 flows from the lower voltage source Vcmi 243 through the second internal resistor 242, to join a second external resistor current $I_{L1}$ to form a current $I_L$ 323 which flows into to the transmitter 210.

As the AC coupling circuitry source Vcmi is not coupled to any DC consuming circuitry (at least via the capacitors 261 and 262), it provides only an AC current to the transmitter 210. Vcmi, therefore, does contribute to IL2 and IH and IL2=IH. The voltage drop across the second internal resistor 242 and the voltage gain across the first internal resistor 241 provide a voltage swing at the input to the differential receiver 220. In this manner the differential receiver sees the transmitter as being AC-coupled.

It may be seen from FIG. 3 that the current IL2 through the second internal resistor 242 contributes to the current IL 323 sunk by the transmitter 210. Additionally, current IH 310 is present in the first external resistor 231 when no current is sunk through the first differential output line 211 to the transmitter 210. The component values may be chosen such that the HDMI specification requirements are still satisfied with the addition of the AC coupling circuitry 240 and subsequent currents. In some embodiments, the constraints placed on the component values may be described by the equations described herein:

The external and internal resistors may be considered as operating in parallel in an ac mode. The effective parallel resistance may be described as:

$$R_{ext} \| R_{int} = \frac{(R_{ext} \cdot R_{int})}{(R_{ext} + R_{int})} \quad (2)$$

Where Rext is the value of external resistor 231 and external resistor 232 and Rint is the value of internal resistor 241 and internal resistor 242. For example in some embodiments, one or more of the resistors 231, 232, 241 and 242 may be chosen to have a resistance of 1000. In this embodiment the coupling capacitors may have a value of 10 to 100 nF. The parallel resistance given by equation (2) may be 50Ω in this embodiment.

According to the HDMI specification, with no AC coupling circuitry, the minimum value of the DC voltage source AVcc 233 should satisfy AVccmin>=3.3V-5%. This would provide the voltage at point A1 greater than or equal to AVcc min when no current is sunk to the transmitter 210 as in FIG. 3. In this case, in embodiments, the AC coupling circuitry 240 allows a current IH through the first external resistor 231. The components may, therefore, take into account that the HDMI specifically requires the minimum voltage at point A1 in FIG. 3 to be greater than 3.3V-5% in order to satisfy the HDMI specification. This may be determined by the following equations:

The currents IH, IL, IL1 and IL2 are related according to the following:

$$IH=IL2 \quad (a)$$

$$IL=IL1+IL2 \quad (b)$$

Substituting (a) into (b)

$$IL=IL1+IH \quad (c)$$

The voltage drop from AVCC to A2 along the second external resistor 232 may be described as:

$$AVcc-V(A2)=IL1*Rext \quad (d)$$

The voltage drop from AVCC to A2 along the first external resistor 231 and first and second internal resistors 241 and 242 can be described as:

$$AVcc-V(A2)=IH*(Rext+Rint+Rint) \quad (e)$$

The relationship between IL1 and IH from (d) and (e) is:

$$IL1/IH=(Rext+2Rint)/Rext$$

$$IL1/IH+1=(Rext+2Rint)/Rext+1$$

$$(IL1+IH)/IH=2*(Rext+Rint)/Rext$$

$$(IL1+IL2)/IH=2*(Rext+Rint)/Rext$$

$$IL/IH=2*[(Rext+Rint)/(Rext*Rint)]*Rint$$

$$IL/IH=2*Rint/[Rext\|Rint]$$

$$IH=IL*[Rext\|Rint]/(2*Rint)$$

$$IH=0.5*IL*[Rext\|Rint]/Rint \quad (f)$$

The voltage at V(A1) is:

$$V(A_1)=AVcc_{min}-I_H \cdot R_{ext} \quad (3)$$

Substituting (c) into (3):

$$V(A_1) + AVcc_{min} - 0.5 \cdot \left(I_{Lmax} \cdot \left(\frac{(R_{ext}\|R_{int})}{(R_{int})}\right) \cdot R_{ext}\right) \geq (3.3 \text{ V} - 5\%) \quad (4)$$

Where V(A1) is the voltage at point A1 when no current is sunk to the transmitter 210. AVcc is the minimum voltage of the DC current source in order to satisfy HDMI requirement. ILmax is the maximum current sunk into the transmitter.

Therefore, in some embodiments the minimum voltage tolerance for the DC voltage source 233 may requires a stricter control. In other words, the tolerance for the minimum voltage provided by the DC voltage source 233 may be less than 5%. In some embodiments the minimum voltage negative tolerance may be between 2.8% and 4%.

In some embodiments, the maximum value for the DC voltage source 233 according to the HDMI specification may be:

$$AVcc_{max} \leq (3.3+5\%) \quad (5)$$

In FIG. 3 current IL is being sunk to transmitter 210. As discussed, this may provide a voltage drop across the second external resistor 232. According to the HDMI specification, the maximum voltage swing Vswingmax may be 0.6V. Additionally, the maximum current sunk into the transmitter ILmax according to the HDMI specification may be 10.909 mA. The sunk current IL comprises current through both the second external resistor 232 and second internal resistor 242. In some embodiments, the resistor values may be chosen such that:

$$I_{Lmax} = \frac{(Vswing_{max})}{(R_{ext}\|R_{int} + 10\%)} = 10.909 \text{ mA} \quad (6)$$

With a 10% tolerance for the parallel resistance.
The voltage at point A2 may be described by:

$$V(A_2)=AVcc_{min}-I_{L1} \cdot R_{ext} \quad (7)$$

Because IL1=ILmax−IL2, and IL1=IH, equation (f) into equation (7) gives a minimum DC voltage 233 and resistor values according:

$$V(A_2) + AVcc_{min} - \left[I_{Lmax} - 0.5 \cdot I_{Lmax} \cdot \left(\frac{(R_{ext}\|R_{int})}{(R_{int})}\right)\right] \cdot R_{ext} \geq \quad (8)$$

$$(3.3 \text{ V} - 5\%) - 0.6 \text{ V}$$

Where V(A2) is the voltage at point A2 when current IL is sunk into transmitter 210. And ILmax is the maximum current to be sunk into the transmitter 210 according to the HDMI specification.

The allowable exemplary tolerances on the components according to the equations (1) to (7) in order to satisfy the HDMI specification may be given by the below table.

TABLE I

| Rext (Ω) | Tolerance % | Rint (Ω) | Tolerance % | AVCC typ (V) | Tolerance % |
|---|---|---|---|---|---|
| 60 | 10% | 300 | 10% | 3.3 | 2.8% |
|  |  |  | 5% |  | 2.9% |
|  | 1% |  | 10% |  | 3.1% |
|  |  |  | 5% |  | 3.2% |
| 55 | 10% | 550 | 10% | 3.3 | 3.9% |
|  |  |  | 5% |  | 3.9% |
|  | 1% |  | 10% |  | 4% |
|  |  |  | 5% |  | 4.1% |

Therefore, per Table I, one may select the component values and tolerances to provide the AVCC tolerance, or vice versa.

It will be appreciated that when the differential transmission is such that current is sunk to the transmitter 210 from transmission line 211 and no current is sunk on line 212, corresponding equations apply.

It will also be appreciated that the given component values are exemplary only, and, in an embodiment, may take on any value that satisfies the HDMI or relevant specification.

In embodiments, the AC coupling circuitry 240 may be coupled to the DC coupling circuitry within a specified distance in order to ensure the signal integrity of the transmitted signal. For example, according to the HDMI specification, the maximum rise/full time of the transmitted signal is 75 ps. In this case, the maximum frequency content corresponds to 0.25 divided by the rise time which may correspond to 3.3 GHz. This may result in a wavelength λ of approximately 9 cm. In some embodiments the AC coupling circuitry may be implemented with the connection length from point A1/A2 to point B1/B2 less than 0.9 cm or λ/10.

In embodiments, the transmitter 210 may couple to a receiver side via an HDMI socket. The receiver side may comprise the DC coupling circuitry 230 and the AC coupling circuitry 240. The DC coupling circuitry 230 and coupling capacitors 261 and 262 may be implemented on board while the AC coupling circuitry 240 and receiver 220 may be implemented on an integrated circuit. In embodiments, the integrated circuit may be implemented using advanced nM CMOS technology. For example, the integrated circuit may use 32 nM like technologies. In other embodiments, the AC coupling circuitry 240 may be implemented on board.

In some embodiments, the transmitter 210 may be coupled to the receiving circuitry 230, 240, and 220 via a cable, for example an HDMI cable.

It is appreciated that although the above description relates to the HDMI specification, embodiments may be equally applicable to other relevant specifications. Furthermore it will be appreciated that component values are by way of example only and modifications may be possible in relation to other specifications.

The transmitter/receiver of FIGS. 2-3 may be part of a system, that includes, for example, a cable box, DVR or DVD player including the transmitter, and an HDTV including the receiver.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
    a HDMI receiver printed circuit board (PCB) having discrete components thereon comprising:
        an HDMI cable connector on the HDMI receiver PCB and configured to receive a differential signal having a DC component at first and second differential lines;
        a first pull-up circuit coupled to the HDMI cable connector and configured to pull up the received differential signal, the first pull-up circuit comprising first and second discrete resistors on the HDMI receiver PCB respectively coupled between the first and second differential lines and a first voltage source;
    a HDMI receiver integrated circuit (IC) having integrated components therein comprising:
        third and fourth differential lines;
        a second pull-up circuit configured to pull up the differential signal without the DC component thereof being present and to output the differential signal thereafter, the second pull-up circuit comprising first and second integrated resistors integrated within the HDMI receiver IC respectively coupled between the third and fourth differential lines and a second voltage source;
        an integrated HDMI receiver coupled to receive the differential signal as output by the second pull-up circuit, the HDMI receiver being integrated using CMOS technology and within the HDMI receiver IC;
    the HDMI receiver PCB further comprising a coupling circuit respectively coupling the first and second differential lines to the third and fourth differential lines and configured to remove the DC component from the differential signal, the coupling circuit comprising first and second discrete capacitors on the HDMI receiver PCB respectively coupling the first and second differential lines to the third and fourth differential lines.

2. The apparatus of claim 1 wherein the first pull-up circuit is HDMI compliant.

3. The apparatus of claim 1 wherein the first and second differential lines form a differential channel on an HDMI compliant cable.

4. An electronic device comprising:
    a first pull-up circuit comprising discrete components configured to receive a differential signal with a DC component from a remote transmitter;
    coupling circuitry comprising discrete components to remove the DC component from the differential signal; and
    an integrated circuit having integrated therein:
        a receiver; and a second pull-up circuit configured to receive the differential signal having no DC component from the coupling circuitry and to output the differential signal to the receiver.

5. The electronic device of claim 4 wherein the receiver comprises an HDMI receiver.

6. A system, comprising:
a transmitter disposed on a transmit board;
a cable coupling the transmit board to a receive board having receiver circuitry disposed thereon;
the receiver circuitry comprising:
a first pull-up circuit comprising discrete components disposed on the receive board for receiving differential signals from the transmitter;
a second pull-up circuit comprising components integrated within an integrated circuit for providing the differential signals to a receiver integrated within the integrated circuit;
coupling circuitry comprising discrete coupling components coupled between the first and second pull-up circuitry; and
a receiver integrated within the integrated circuit and coupled to the second pull-up circuit.

7. The system of claim 6 wherein the transmitter sees the receiver circuitry as dc-coupled and the receiver circuitry sees the transmitter as ac-coupled.

8. The of claim 6 wherein the cable comprises an HDMI cable.

9. A system, comprising:
first and second supply nodes;
a first amplifier having first and second differential output nodes;
a printed circuit board (PCB) having discrete components thereon comprising:
a first pull-up impedance having a first node coupled to the first differential output node and having a second node coupled to the first supply node;
a second pull-up impedance adjacent to the first pull-up impedance, the second pull-up impedance having a first node coupled to the second differential output node and having a second node coupled to the first supply node;
a first capacitor having a first node coupled to the first differential output node and having a second node;
a second capacitor having a first node coupled to the second differential output node and having a second node;
an integrated circuit having integrated components therein comprising:
a receiver amplifier having first and second differential input nodes respectively coupled to the second nodes of the first and second capacitors;
a third pull-up impedance having a first node coupled to the first differential input node and having a second node coupled to the second supply node; and
a fourth pull-up impedance having a first node coupled to the second differential input node and having a second node coupled to the second supply node.

10. The system of claim 9, further comprising:
an additional printed circuit board;
wherein the first amplifier is disposed on the additional printed circuit board; and
a cable having:
a first conductor coupled between the first differential output node and the first node of the first capacitor; and
a second conductor coupled between the second differential output node and the first node of the second capacitor.

11. The system of claim 10, wherein the cable comprises a high-definition-multimedia-interface cable.

12. The system of claim 10, wherein the first amplifier is integrated within an additional integrated circuit disposed on the additional printed circuit board.

13. The system of claim 9, further comprising:
an additional printed circuit board;
an additional integrated circuit disposed on the additional circuit board;
wherein the first amplifier is disposed within the additional integrated circuit; and
a cable coupled between the printed circuit board and additional printed circuit board and having:
a first conductor coupled between the first differential output node and the first node of the first capacitor; and
a second conductor coupled between the second differential output node and the first node of the second capacitor.

14. The system of claim 13, wherein the cable comprises a high-definition-multimedia-interface cable.

15. The system of claim 9 wherein the first, second, third, and fourth pull-up impedances have approximately a same value.

16. The system of claim 9 wherein a parallel combination of the first and third pull-up impedances approximately equals a parallel combination of the second and fourth pull-up impedances.

17. The system of claim 9 wherein:
the first, second, third, and fourth pull-up impedances comprise first, second, third, and fourth resistances; and
wherein a parallel combination of the first and third pull-up impedances and a parallel combination of the second and fourth pull-up impedances approximately equal fifty ohms.

18. The apparatus of claim 1 wherein the first pull-up circuit and the second pull-up circuit are disposed proximate to each other.

* * * * *